(12) United States Patent
Hasegawa

(10) Patent No.: US 6,515,886 B2
(45) Date of Patent: Feb. 4, 2003

(54) ELECTRONIC APPARATUS HAVING SOCKET INCORPORATING SWITCH OPERATED BY INSERTION OF ELECTRONIC CIRCUIT DEVICE

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 97 days.

(21) Appl. No.: 09/820,343

(22) Filed: Mar. 29, 2001

(65) Prior Publication Data

US 2001/0033108 A1 Oct. 25, 2001

(30) Foreign Application Priority Data

Apr. 24, 2000 (JP) ......................................... 2000-122967

(51) Int. Cl.[7] .................................................. G11C 5/06
(52) U.S. Cl. ............................ 365/63; 365/51; 361/100
(58) Field of Search .............................. 365/52, 63, 51; 340/632, 686.4; 307/147; 361/100, 781; 324/158 R

(56) References Cited

U.S. PATENT DOCUMENTS

| 4,829,239 | A | * | 5/1989 | Holstein et al. ............. 324/111 |
| 5,225,775 | A | * | 7/1993 | Sekino ..................... 324/158.1 |
| 5,625,238 | A | * | 4/1997 | Ady et al. ................... 307/147 |
| 5,640,312 | A | * | 6/1997 | Carroll ....................... 323/902 |

* cited by examiner

Primary Examiner—Richard Elms
Assistant Examiner—Hien Nguyen
(74) Attorney, Agent, or Firm—Sughrue Mion, PLLC

(57) ABSTRACT

In an electronic apparatus including an electronic circuit device, a board and a control circuit device for controlling the electronic circuit device, a socket for mounting the electronic circuit device is mounted on the board. The socket incorporates a switch for electrically connecting the control circuit device to a reference voltage line when the electronic circuit device is not mounted in the socket and electrically connecting the control circuit device to the electronic circuit device when the electronic circuit device is mounted in the socket.

9 Claims, 3 Drawing Sheets

ELECTRONIC APPARATUS HAVING SOCKET INCORPORATING SWITCH OPERATED BY INSERTION OF ELECTRONIC CIRCUIT DEVICE

BACKGROUND OF THE INVENTION

1. Field of the Invention

The present invention relates to an electronic apparatus having a socket for mounting an electronic circuit device such as a memory card.

2. Description of the Related Art

In a prior art electronic apparatus including an electronic circuit device, a board and a control circuit device for controlling the electronic circuit device, a socket for mounting the electronic circuit device is mounted on the board.

For example, if such an electronic circuit device is a Rambus-type memory card provided by Rambus Inc., a plurality of sockets for mounting memory cards are mounted on one board. In this case, the control circuit device is a memory access circuit device for accessing each of the memory cards. In addition, when one memory card is not mounted in one socket, the respective memory access circuit device has to be grounded to secure the reliability thereof.

In the prior art electronic apparatus, however, since the connection/disconnection of each memory access circuit device is carried out by manually closing/opening a respective jumper pin provided on the board, an erroneous operation may occur, which would increase the manufacturing cost and deteriorate the reliability.

SUMMARY OF THE INVENTION

It is an object of the present invention to improve the manufacturing cost and the reliability of an electronic apparatus having a socket for mounting an electronic circuit device such as a memory card.

According to the present invention, in an electronic apparatus including an electronic circuit device, board and a control circuit device for controlling the electronic circuit device, a socket for mounting the electronic circuit device is mounted on the board. The socket incorporates a switch for electrically connecting the control circuit device to a reference voltage line when the electronic circuit device is not mounted in the socket and electrically connecting the control circuit device to the electronic circuit device when the electronic circuit device is mounted in the, socket.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENT

Figure 1:
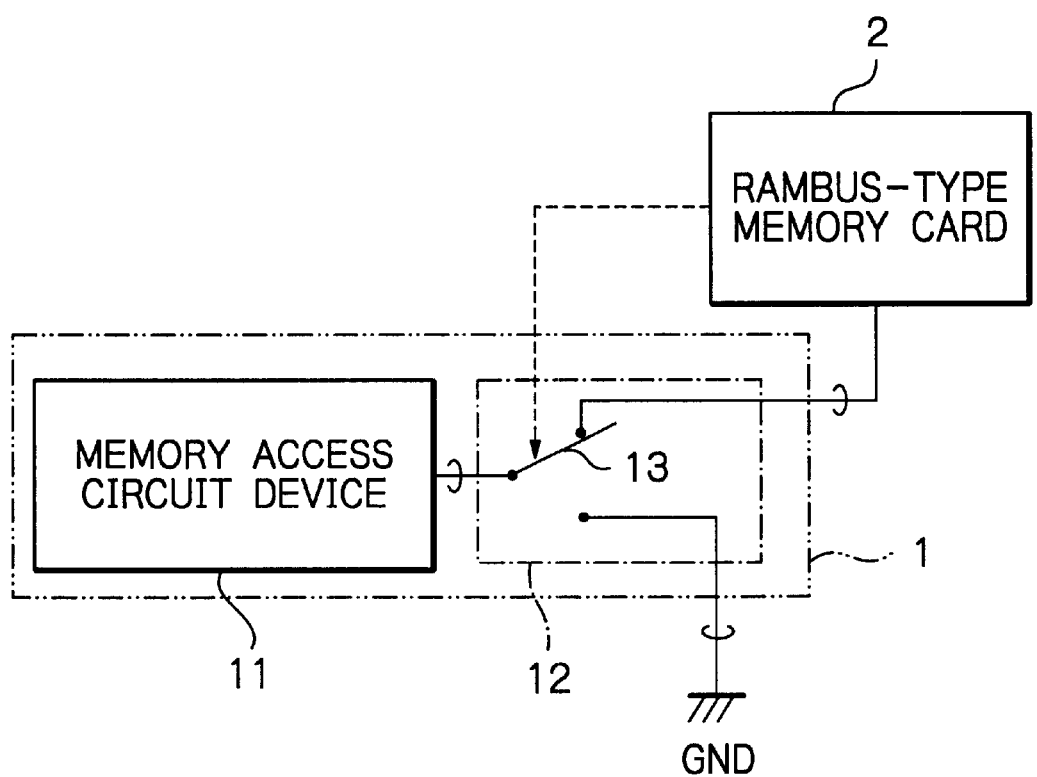
FIG. 1 is a block circuit diagram illustrating an embodiment of the electronic apparatus according to the present invention.

In FIG. 1, which illustrates an embodiment of the electronic apparatus according to the present invention, reference numeral 1 designates a board (motherboard or main board) on which a memory access circuit device 11 and a socket (or card ejector) 12 are mounted. Also, a Rambus-type memory card 2 is mounted in the socket 12 of the board 1.

The socket 12 incorporates a switch 13 for 30 connecting the memory access circuit device 11 to the memory card 2. In this case, the switch 13 has a plurality of switch elements each for connecting one terminal of the memory access circuit device 11 to a respective one terminal of the memory card 2.

When the memory card 2 is not mounted in the socket 12, the switch 13 is pulled down, so that the terminals of the memory access circuit device 11 are grounded. On the other hand, when the memory card 2 is mounted in the socket 12, the switch 13 is pulled up, so that the terminals of the memory access circuit device 11 are connected via the switch 13 to the memory card 2, and thus, the memory access circuit device 11 can access the memory card 2.

Figure 2:
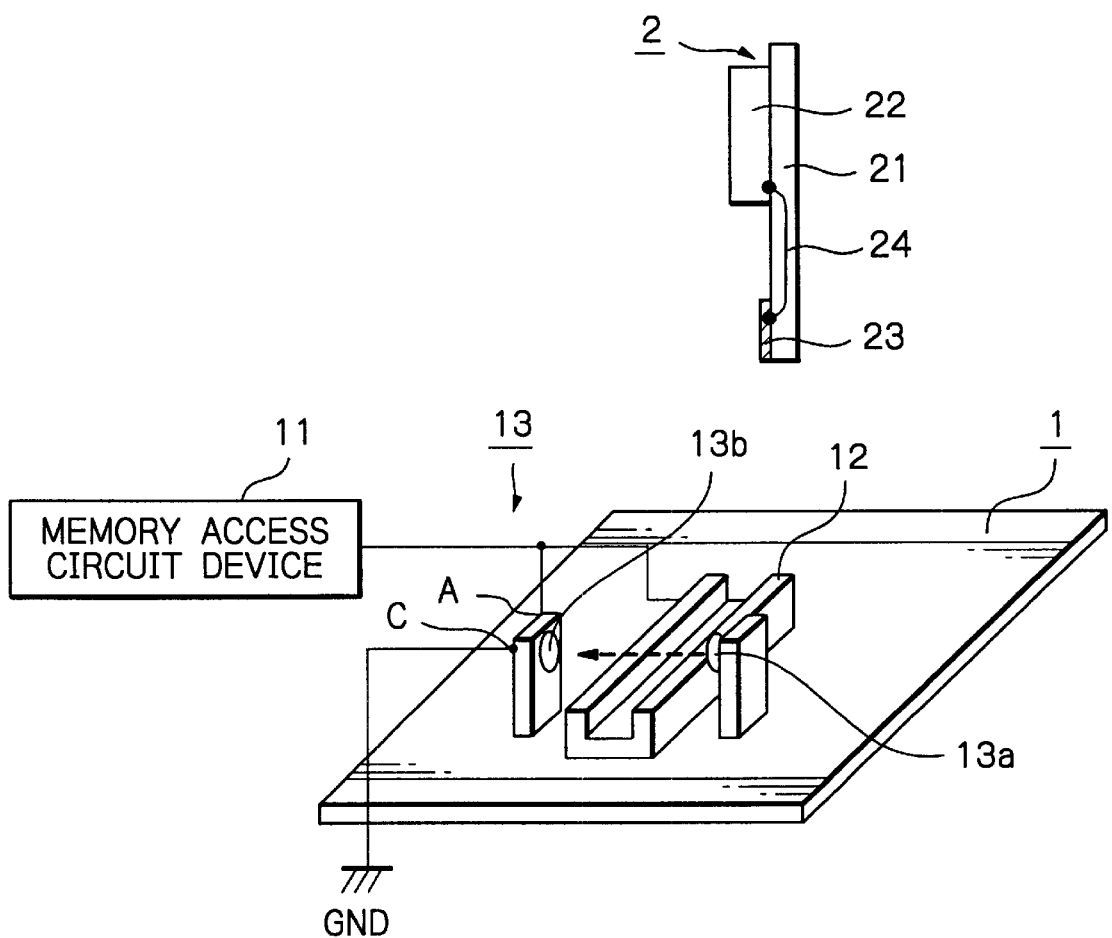
FIG. 2 is a detailed diagram illustrating a first example of the electronic apparatus of FIG. 1.

In FIG. 2, which is a detailed diagram of a first example of the electronic apparatus of FIG. 1, the memory access circuit device 11 is actually mounted on the board 1.

The memory card 2 is constructed by an interposer substrate 21 on which a semiconductor chip 22 and terminals 23 are mounted. The semiconductor chip 22 is electrically connected by wires 24 to the terminals 23.

The switch 13 is constructed by an optical switch formed by a light emitting diode 13a and a photo diode 13b having an anode terminal A connected to the memory access circuit device 11 and one terminal (not shown) of the socket 12 and a grounded cathode C. Note that, although only one light emitting diode and only one photo diode are illustrated in FIG. 2, a plurality of light emitting diodes and a plurality of photo diodes are actually provided in correspondence with the terminals of the memory access circuit device 11 and the terminals 23 of the memory card 2.

Also, terminals (not shown) are provided on an inner wall of the socket 12 in correspondence with the terminals 23 of the memory card 2.

When the memory card 2 is not mounted in the socket 12, the photo diode 13b receives infrared light from the light emitting diode 13a, so that the anode A and the cathode C of the photo diode 13b are short-circuited. As a result, the terminals of the memory access circuit device 11 are grounded by the turned-ON switch 13.

On the other hand, when the memory card 2 is mounted in the socket 12, the photo.diode 13b does not receive infrared light from the light emitting diode 13a, so that the anode A and the cathode C of the photo diode 13b are opened. As a result, the terminals of the memory access circuit device 11 are electrically connected to the terminals 23 of the memory card 2. Thus, the memory access circuit device It can access the memory card 2.

In the first example as illustrated in FIG. 2, other optical switches can be used. Also, a photo transistor can be used instead of the photo diode 13b.

Figure 3:
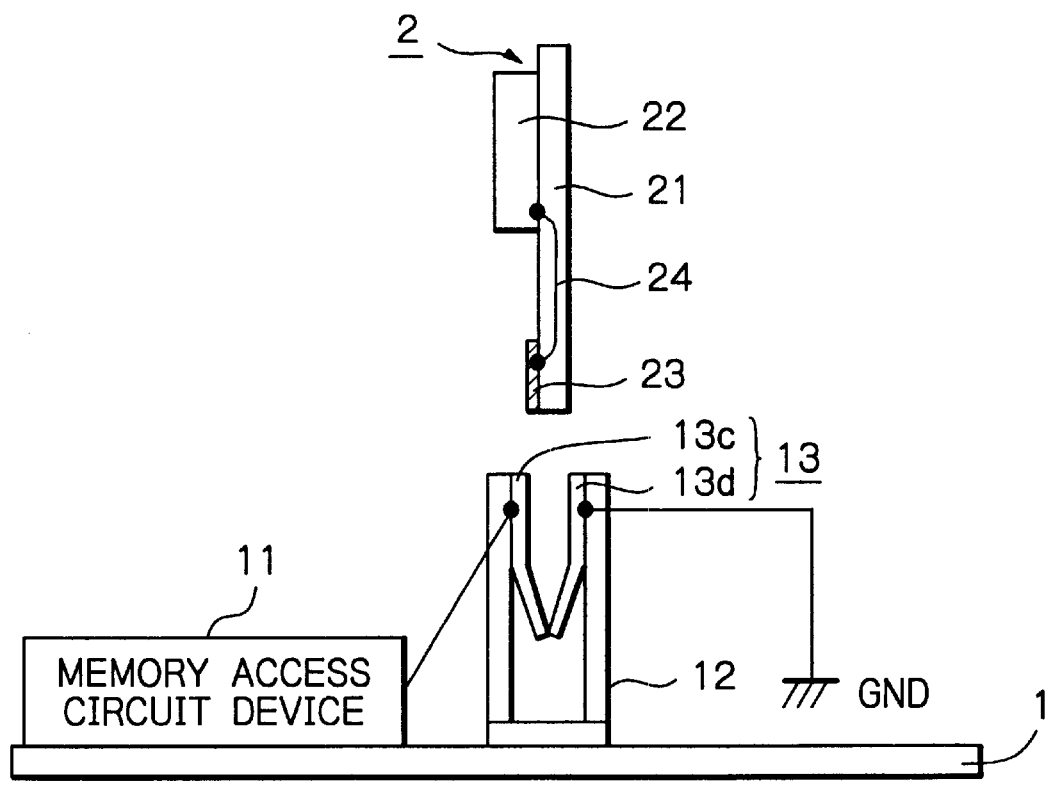
FIG. 3 is a detailed diagram illustrating a second example of the electronic apparatus of FIG. 1.

In FIG. 3, which is a detailed diagram of a second example of the electronic apparatus of FIG. 1, the switch 13 is constructed by a mechanical switch formed by terminals 13c and 13d opposing each other within inner walls of the socket 12. The terminals 13c and 13d are made of punched bronze, and are bent at their ends, so that the terminals 13c and 13d are in contact with each other at their ends by the elasticity thereof. Note that, although only one pair of the terminals 13c and 13d are illustrated in FIG. 3, a plurality of terminal pairs are actually provided in correspondence with the terminals of the memory access circuit device and the terminals 23 of the memory card 2.

When the memory card 2 is not mounted in the socket 12, the terminals 13c and 13d are in contact with each other. As a result, the terminals of the memory access circuit device 11 are grounded by the turned-ON switch 13.

On the other hand, when the memory card 2 is mounted in the socket 12, so that each of the terminals 23 of the memory card 2 are in contact with the terminals 13c, the terminal 13c is separated from the terminals 13d. As a result, the terminals of the memory access circuit device 11 are electrically connected to the terminals 23 of the memory card 2. Thus, the memory access circuit device 11 can access the memory card 2.

The present invention can be applied to an electronic apparatus including an electronic circuit device other than the Rambus-type memory card and a control circuit device for controlling the electronic circuit device where the control circuit device needs to be grounded when the electronic circuit device is not connected thereto.

As explained hereinabove, according to the present invention, since the connection between an electronic circuit device and a reference voltage line is automatically switched simultaneously with mounting the electronic circuit device on a socket, the manufacturing cost and the reliability can be improved.

What is claimed is:

1. An electronic apparatus comprising:
   an electronic circuit device;
   a board;
   a control circuit device, mounted on said board, for controlling said electronic circuit device;
   a socket, mounted on said board, for mounting said electronic circuit device,
   said socket incorporating a switch for electrically connecting said control circuit device to a reference voltage line when said electronic circuit device is not mounted in said socket and electrically connecting said control circuit device to said electronic circuit device when said electronic circuit device is mounted in said socket.

2. The apparatus as set forth in claim 1, wherein said reference voltage line is a ground line.

3. The apparatus as set forth in claim 1, wherein said electronic circuit device is a memory card, and said control circuit device comprises a memory access circuit for accessing said memory card.

4. The apparatus as set forth in claim 1, wherein said switch comprises an optical switch.

5. The apparatus as set forth in claim 4, wherein said optical switch comprises:
   a light emitting element; and
   a light receiving element, connected between said control circuit device and said electronic circuit device, for receiving light from said light emitting element,
   the light from said light emitting element to said light receiving element turning ON said light receiving element to electrically connect said control circuit device to said reference voltage line when said electronic circuit device is not mounted in said socket,
   the light from said light emitting element to said light receiving element being shut off to turn OFF said light receiving element to electrically connect said control circuit device to said electronic circuit device when said electronic circuit device is mounted in said socket.

6. The apparatus as set forth in claim 1, wherein said switch comprises a mechanical switch.

7. The apparatus as set forth in claim 6, wherein said mechanical switch comprises:
   a first terminal connected to said control circuit device and mounted on a first inner wall of said socket; and
   a second terminal connected to said reference voltage line and mounted on a second inner wall of said socket;
   said first and second terminals being in contact with each other to electrically connect said control circuit device to said reference voltage line when said electronic circuit device is not mounted in said socket,
   said first and second terminals being separated from each other to electrically connect said control circuit device to said electronic circuit device when said electronic circuit device is mounted in said socket.

8. An electronic apparatus comprising:
   a Rambus-type memory card;
   a board;
   a memory access circuit device, mounted on said board, for controlling said Rambus-type memory card;
   a socket, mounted on said board, for mounting said Rambus-type memory card,
   said socket incorporating a switch for electrically connecting said memory access circuit device to a reference voltage line when said Rambus-type memory card is not mounted in said socket and electrically connecting said memory access circuit device to said Rambus-type memory card when said Rambus-type memory card is mounted in said socket.

9. A socket for mounting a electronic circuit device, comprising a switch for electrically connecting a control circuit device for controlling said electronic circuit device to a reference voltage line when said electronic circuit device is not mounted in said socket and electrically connecting a control circuit device to said electronic circuit device when said electronic circuit device is mounted in said socket.

* * * * *